(12) United States Patent
Chen (10) Patent No.: US 10,211,134 B2
(45) Date of Patent: Feb. 19, 2019

(54) SEMICONDUCTOR PACKAGE

(71) Applicant: MEDIATEK INC., Hsin-Chu (TW)

(72) Inventor: Nan-Jang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/831,408

(22) Filed: Dec. 5, 2017

(65) Prior Publication Data
US 2018/0096922 A1 Apr. 5, 2018

Related U.S. Application Data

(63) Continuation-in-part of application No. 15/185,035, filed on Jun. 17, 2016, now Pat. No. 9,852,966, which
(Continued)

(51) Int. Cl.
*H01L 23/00* (2006.01)
*H01L 23/31* (2006.01)
*H01L 23/495* (2006.01)

(52) U.S. Cl.
CPC .. *H01L 23/49589* (2013.01); *H01L 23/49503* (2013.01); *H01L 23/49541* (2013.01); *H01L 23/49544* (2013.01); *H01L 23/49551* (2013.01); *H01L 23/49575* (2013.01); *H01L 24/32* (2013.01); *H01L 24/48* (2013.01); *H01L 24/49* (2013.01); *H01L 24/73* (2013.01); *H01L 23/3107* (2013.01); *H01L 23/49517* (2013.01); *H01L 24/05* (2013.01); *H01L 24/06* (2013.01); *H01L 24/29* (2013.01); *H01L 24/45* (2013.01);
(Continued)

(58) Field of Classification Search
CPC ................................. H01L 23/49589
See application file for complete search history.

(56) References Cited

U.S. PATENT DOCUMENTS

| 6,093,957 A | 7/2000 | Kwon |
| 6,258,629 B1 | 7/2001 | Niones et al. |

(Continued)

FOREIGN PATENT DOCUMENTS

| CN | 101350318 A | 1/2009 |
| JP | 6252328 | 9/1994 |

(Continued)

OTHER PUBLICATIONS

"International Search Report" dated Jan. 3, 2013 for International application No. PCT/CN2012/082270, International filing date:Sep. 28, 2012.

(Continued)

*Primary Examiner* — William A Harriston
(74) *Attorney, Agent, or Firm* — Winston Hsu (57) ABSTRACT

A semiconductor package includes a die pad, a semiconductor die mounted on the die pad, rows of terminal leads disposed around the die pad; a surface mount device (SMD) mounted and bonded with a bond wire in the semiconductor package; and a molding compound encapsulating the semiconductor die and the SMD, the bond wire, and at least partially encapsulating the die pad and the terminal leads. The SMD may be mounted in the semiconductor package by using a non-conductive paste or a conductive paste. The die pad, the tie bars and the terminal leads are coplanar.

23 Claims, 11 Drawing Sheets

Related U.S. Application Data is a continuation-in-part of application No. 14/566,689, filed on Dec. 10, 2014, now Pat. No. 9,406,595, which is a continuation of application No. 13/626,899, filed on Sep. 26, 2012, now Pat. No. 8,941,221.

(60) Provisional application No. 61/541,235, filed on Sep. 30, 2011.

(52) U.S. Cl.
CPC ........... *H01L 2224/05554* (2013.01); *H01L 2224/05639* (2013.01); *H01L 2224/05644* (2013.01); *H01L 2224/05664* (2013.01); *H01L 2224/05669* (2013.01); *H01L 2224/2919* (2013.01); *H01L 2224/29339* (2013.01); *H01L 2224/32245* (2013.01); *H01L 2224/45139* (2013.01); *H01L 2224/45144* (2013.01); *H01L 2224/45164* (2013.01); *H01L 2224/45169* (2013.01); *H01L 2224/48091* (2013.01); *H01L 2224/48095* (2013.01); *H01L 2224/48247* (2013.01); *H01L 2224/48257* (2013.01); *H01L 2224/49109* (2013.01); *H01L 2224/49113* (2013.01); *H01L 2224/49171* (2013.01); *H01L 2224/73265* (2013.01); *H01L 2924/00* (2013.01); *H01L 2924/00012* (2013.01); *H01L 2924/00014* (2013.01); *H01L 2924/14361* (2013.01); *H01L 2924/181* (2013.01); *H01L 2924/1904* (2013.01); *H01L 2924/19011* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01); *H01L 2924/19107* (2013.01); *H01L 2924/3011* (2013.01)

(56) References Cited

U.S. PATENT DOCUMENTS

| | | | |
|---|---|---|---|
| 6,396,139 B1 | 5/2002 | Huang | |
| 6,627,977 B1 | 9/2003 | Foster | |
| 6,798,046 B1 | 9/2004 | Miks | |
| 2005/0173783 A1* | 8/2005 | Chow | H01L 21/56 257/666 |
| 2008/0128876 A1* | 6/2008 | Liu | H01L 23/4951 257/676 |
| 2009/0278248 A1* | 11/2009 | Matsumura | H01L 23/49503 257/690 |
| 2010/0001386 A1 | 1/2010 | Misumi | |
| 2010/0207244 A1 | 8/2010 | Terui | |

FOREIGN PATENT DOCUMENTS

| | | |
|---|---|---|
| JP | 870090 | 3/1996 |
| JP | 9293822 | 11/1997 |
| JP | 2004241579 | 8/2004 |
| WO | 96/30943 A1 | 10/1996 |

OTHER PUBLICATIONS

Jan M. Rabaey, Digital Integrated Circuits, p. 176,198, Jan. 18, 2002.

Vishram S. Pandit, Power Integrity for I/O Interfaces: With Signal Integrity/Power Integrity Co-Design, Chapter 1, Oct. 13, 2010.

Swaminathan, Madhavan, Power Integrity Modeling and Design for Semiconductors and Systems, Section1.13.~1.14.,1.2.4., Nov. 19, 2007.

* cited by examiner

SEMICONDUCTOR PACKAGE

CROSS REFERENCE TO RELATED APPLICATION

This is a continuation-in-part of U.S. application Ser. No. 15/185,035 filed Jun. 17, 2016, which itself is a continuation-in-part of U.S. application Ser. No. 14/566,689 filed Dec. 10, 2014, now U.S. Pat. No. 9,406,595B2. U.S. application Ser. No. 14/566,689 is a continuation of U.S. application Ser. No. 13/626,899 filed Sep. 26, 2012, now U.S. Pat. No. 8,941,221B2, which claims the benefit of U.S. provisional application No. 61/541,235, filed Sep. 30, 2011. All of the above-mentioned applications are included herein in their entirety by reference.

BACKGROUND

The present invention relates generally to integrated circuit (IC) package technology. More particularly, the present invention relates to a semiconductor package including a leadframe with power bars or power ring, which is capable of improving power supply variations and suppressing power noise.

Semiconductor dies are conventionally enclosed in plastic packages that provide protection from harsh environments and enable electrical interconnection between the semiconductor die and a substrate or circuit board. Such an integrated circuit (IC) package typically includes a metal substrate or a leadframe, a semiconductor die mounted on a die pad of the leadframe, and bond wires electrically connecting bond pads on the semiconductor die to inner leads of the leadframe. The leadframe, the bond wires, and the semiconductor die are typically encapsulated in a molding compound.

The technology trends in the back-end packaging industry can be summarized as "more functionality in a smaller space". The integrated circuit chip is becoming more and more complicated, leading to increased number of external connection pins of the leadframe package. As the pin count is increased, the cost of packaging is increased accordingly.

Further, as the integration and performance of semiconductor dies increase, the impact of power noise on I/O signaling is significant. It is desirable to provide of stable supply voltage during chip operation. Furthermore, in some circumstances, a number of bond wires extending from bond pads on a chip are bonded onto one single inner lead of a leadframe in the package. The crowded wires bonded to one single lead result in reliability and yield issues.

In light of the above, there is a strong need in this industry to provide an improved semiconductor package structure and leadframe package, which are cost-effective, particularly suited for high-speed semiconductor dies, and are capable of improving power supply variations and suppressing power noise.

SUMMARY

In one aspect, this disclosure provides a semiconductor package including a die pad, a semiconductor die mounted on the die pad, rows of terminal leads disposed around the die pad; a surface mount device (SMD) mounted in the semiconductor package; and a molding compound encapsulating the semiconductor die and the SMD, and at least partially encapsulating the die pad and the terminal leads. The SMD may be mounted in the semiconductor package by using a non-conductive paste or a conductive paste.

According to one embodiment, a ground bar is disposed between the terminal leads and the die pad. A plurality of tie bars is provided for connecting the ground bar with the die pad. A power bar may be disposed between the terminal leads and the die pad or between the ground bar and the terminal leads.

According to one embodiment, the SMD may be mounted between the die pad and the power bar or mounted between the ground bar and the power bar.

According to one embodiment, the SMD may be mounted between the ground bar and the terminal leads.

According to one embodiment, the SMD may be mounted directly on the die pad.

According to one embodiment, the SMD may be mounted on the terminal leads.

According to one embodiment, the SMD may be mounted on an active top surface of the semiconductor die.

According to one embodiment, the SMD comprises a first terminal and a second terminal, and at least one bond wire is bonded to the first terminal or the second terminal. The first terminal may be electrically connected to a ground pad on the semiconductor die, the ground bar, the die pad, or a ground lead of the terminal leads. The second terminal may be electrically connected to power pads on the semiconductor die, the power bar, or the power lead of the terminal leads.

According to one embodiment, the SMD comprises a passive discrete device. The passive discrete device comprises a resistor, an inductor, a capacitor, an RLC (resistor-inductor-capacitor) device, an ESD (electrostatic discharge) device, an IPD (integrated passive device), or a crystal oscillator device.

According to one embodiment, the die pad, the ground bar, the power bar, the tie bars and the terminal leads are coplanar.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The present invention pertains to an improved semiconductor package, as described below, which is suited for the applications including, but not limited to, LQFP (Low-Profile Quad Flat Pack) packaging, TQFP (Thin Quad Flat Pack) packaging, QFN (Quad Flat Non-leaded) packaging, DFN (Dual Flat No-lead) packaging, multi-zone QFN, multi-die flip-chip packaging, and other applicable packaging technologies.

Figure 1:
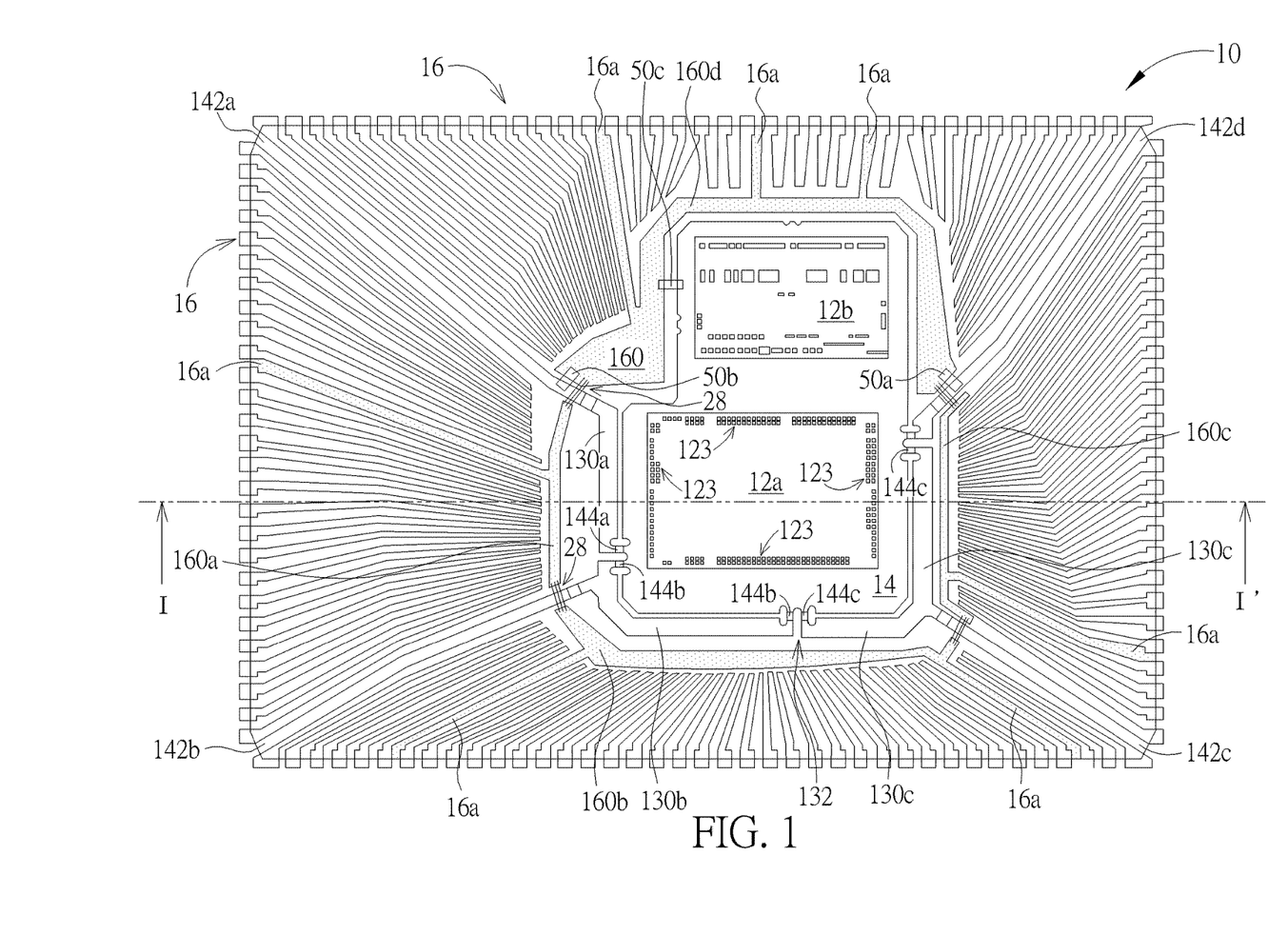
FIG. 1 illustrates a schematic top view of an exemplary leadframe package according to one embodiment of the invention.
Figure 2:
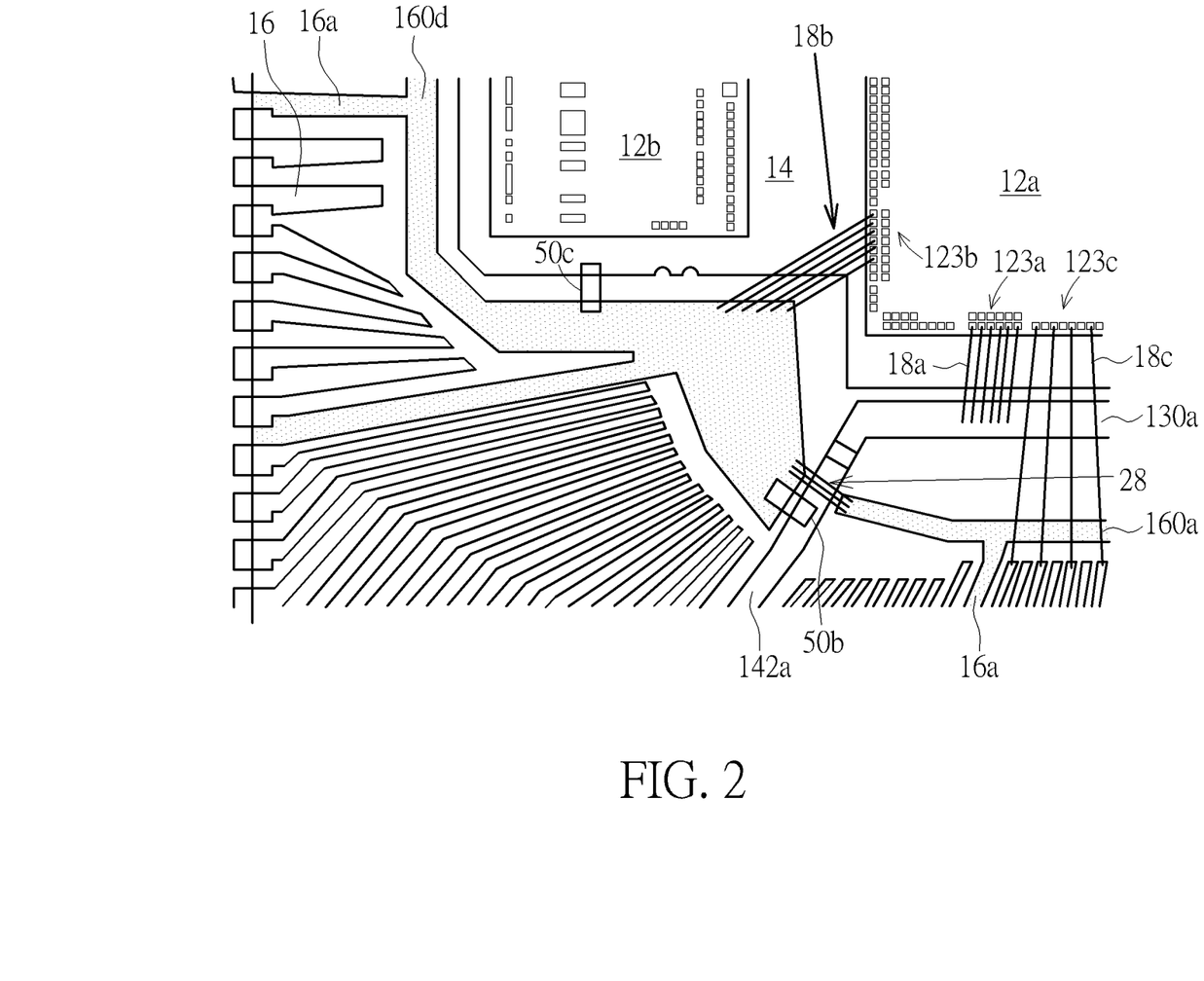
FIG. 2 is an enlarged top view showing a germane portion of the leadframe package of FIG. 1.
Figure 3:
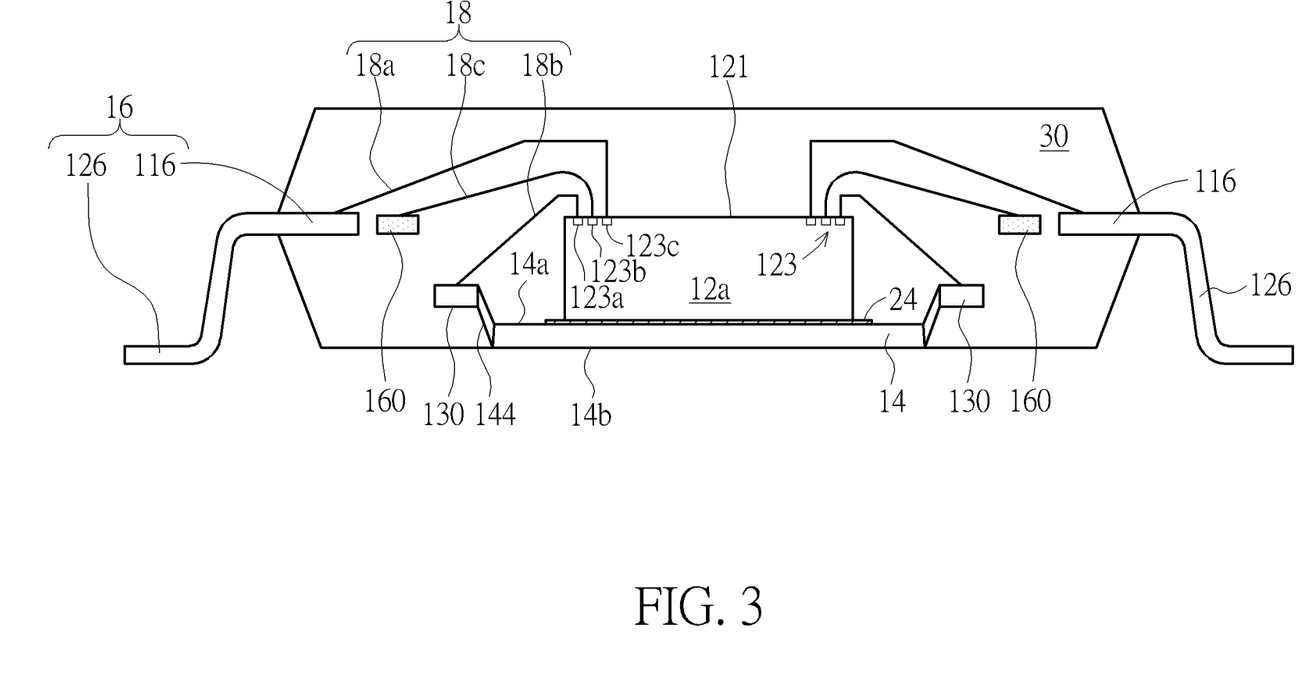
FIG. 3 is a schematic, cross-sectional view taken along line I-I' of FIG. 1.

Please refer to FIGS. 1-3. FIG. 1 illustrates a schematic top view of an exemplary leadframe package 10 according to one embodiment of the invention. FIG. 2 is an enlarged top view showing a germane portion of the leadframe package 10. FIG. 3 is a schematic, cross-sectional view taken along line I-I' of FIG. 1. As shown in FIGS. 1-3, in general, the leadframe package 10 includes at least one semiconductor die 12a that is mounted on a die pad 14 and is adhered to a top surface 14a of the die pad 14 by using an adhesive 24 such as silver paste or epoxy. According to one embodiment, the bottom surface 14b of the die pad 14 may be exposed within the package body. The exposed bottom surface 14b of the die pad 14 helps dissipate heat generated by the semiconductor die 12a, which is also known as an exposed die pad or E-pad configuration. Typically, the exposed bottom surface 14b of the die pad 14 may be used for electrically connecting to a ground layer of a printed circuit board (PCB). According to one embodiment, four slender connecting bars 142a~142d extend inward from respective four corners of the leadframe package 10 to support the die pad 14. Leads 16 including inner leads 116 and outer leads 126 are arranged along the peripheral edges of the die pad 14, which provide electrical connection between the semiconductor die 12a and other devices such as a circuit board. The semiconductor die 12a and the leadframe including the die pad 14 and the inner leads 116 are encapsulated in a molding compound 30.

According to one embodiment, the semiconductor die 12a may be a TV chip or a system-on-a-chip (SoC) chip for digital TV applications, but should not be limited thereto. According to one embodiment, the leadframe package 10 may further include a semiconductor chip 12b. The semiconductor die 12a and the semiconductor chip 12b are disposed side-by-side and are arranged on the same plane (top surface 14a) of the die pad 14. For example, the semiconductor chip 12b may be a DDR2 or DDR3 DRAM chip, but should not be limited thereto. According to one embodiment, the semiconductor chip 12b may be situated farther from a $V_{CCK}$ core power supply rail of a two-layer printed circuit board (not shown) than the semiconductor die 12a. According to one embodiment, several rows of bond pads 123 may be provided on an active top surface 121 of the semiconductor die 12a along four side edges thereof.

According to one embodiment, the inner leads 116 are arranged in a first horizontal plane along the peripheral edges of the die pad 14. The leadframe package 10 may further comprise a ground bar 130 downset from the first horizontal plane to a lower second horizontal plane between the inner leads 116 and the die pad 14, and a plurality of downset tie bars 144 connecting the ground bar 130 with the die pad 14. According to one embodiment, the ground bar 130 extends along at least one peripheral edge of the die pad 14 and is integrally connected to one of the connecting bars 142. Therefore, the ground bar 130, the connecting bars 142, and the die pad 14 have the same voltage potential, i.e., ground level.

In FIG. 1, for example, the leadframe package 10 comprises a first ground bar 130a extending along at one peripheral edge segment of the die pad 14, a second ground bar 130b extending along at two peripheral edge segments of the die pad 14, and a third ground bar 130c extending along at two peripheral edge segments of the die pad 14, such that the first, second and third ground bars partially circumvent the die pad 14. The first ground bar 130a with its one distal end connecting to the first connecting bar 142a is integrally connected to the die pad 14 with a downset tie bar 144a. A discontinuity or gap 132 is formed between the first ground bar 130a and the second ground bar 130b. The second ground bar 130b is integrally connected to the die pad 14 with downset tie bars 144b and is integrally connected to the second connecting bar 142b. Likewise, a discontinuity or gap 132 is provided between the second ground bar 130b and the third ground bar 130c. The third ground bar 130c is integrally connected to the die pad 14 with downset tie bars 144c and is integrally connected to the third connecting bar 142c. In this case, no ground bar is provided around the semiconductor chip 12b.

According to one embodiment, the leadframe package 10 further comprises a power bar 160 disposed on either side of one connecting bar 142 and does not contact the connecting bar 142. That is, the power bar 160 is electrically isolated from the connecting bar 142 and provides power signal having different voltage level from ground level of the connecting bar 142. According to one embodiment, for example, the power bars 160 are flush with the inner leads 116 in the first horizontal plane and extend along the peripheral edges of the die pad 14. Each of the power bars 160 is respectively integrally connected to at least one power leads 16a that are designated to supply power voltage such as core power.

In FIG. 1, for example, a first power bar 160a extends substantially in parallel with the first ground bar 130a and between the first connecting bar 142a and the second connecting bar 142b. The first power bar 160a is integrally connected to one power lead 16a. A second power bar 160b extends substantially in parallel with the second ground bar 130b and between the second connecting bar 142b and the third connecting bar 142c. The second power bar 160b is integrally connected to two power leads 16a. The first power bar 160a is electrically connected to the second power bar 160b by using connection member 28 traversing the second connecting bar 142b. For example, the connection member 28 may comprise bond wires, conductive straps, jumpers or resistors with zero resistance (0Ω resistors), or the like. The connection member 28 does not contact the second connecting bar 142b. A third power bar 160c extends substantially in parallel with the third ground bar 130c and between the third connecting bar 142c and the fourth connecting bar 142d. The third power bar 160c is integrally connected to one single power lead 16a. Likewise, the second power bar 160b is electrically connected to the third power bar 160c by using connection member 28 traversing the third connecting bar 142c.

A fourth power bar 160d extends along three peripheral edges segments of the die pad 14 between the first connecting bar 142a and the fourth connecting bar 142d. The fourth power bar 160d partially circumvents the die pad 14 and is disposed adjacent to the semiconductor chip 12b. As shown in FIG. 1, the fourth power bar 160d is integrally connected to three power lead 16a. The fourth power bar 160d is electrically connected to the third power bar 160c by using connection member 28 traversing the fourth connecting bar 142d. Optionally, a decoupling capacitor 50a may be mounted between the fourth power bar 160d and the fourth connecting bar 142d for suppressing power noise. Likewise, the fourth power bar 160d is electrically connected to the first power bar 160a by using connection member 28 traversing the first connecting bar 142a. Optionally, a decoupling capacitor 50b may be mounted between the fourth power bar 160d and the first connecting bar 142a and a decoupling capacitor 50c may be mounted between the fourth power bar 160d and the die pad 14 for suppressing power noise. According to the embodiment, the first, second, third and fourth power bars are electrically connected together so as to form a continuous power ring that completely circumvents the die pad 14, which reduces the power impedance and the power noise. However, it is to be understood that in some cases the first, second, third and fourth power bars may not be electrically connected together.

According to one embodiment, the bond pads 123 on the semiconductor die 12a, which are also known as input/output pads or I/O pads, may generally comprise ground pads 123a, power pads 123b, and signal pads 123c, etc. The bond pads 123 are electrically coupled to corresponding ground bar 130, the inner leads 116, or the power bar 160 through bond wires 18. For example, the ground pads 123a are electrically coupled to the ground bar 130 through the bond wires 18a, the power pads 123b are electrically coupled to the power bar 160 through the bond wires 18b, and the signal pads 123c are electrically coupled to the inner leads 116 through the bond wires 18c. More bond wires can be bonded due to the larger area of the power bar that will improve the crowded wires bonded to one single lead resulting in reliability and yield issues.

Figure 4:
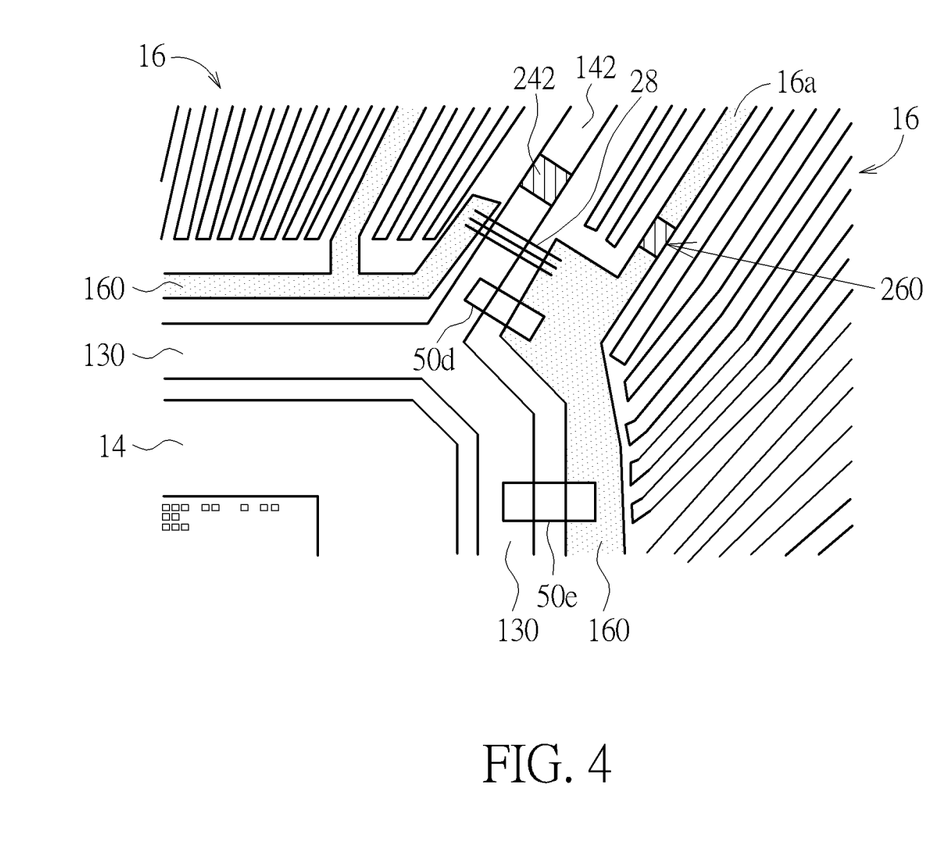
FIG. 4 is enlarged top view showing a germane portion of a leadframe package in accordance with another embodiment of the invention.
Figure 5:
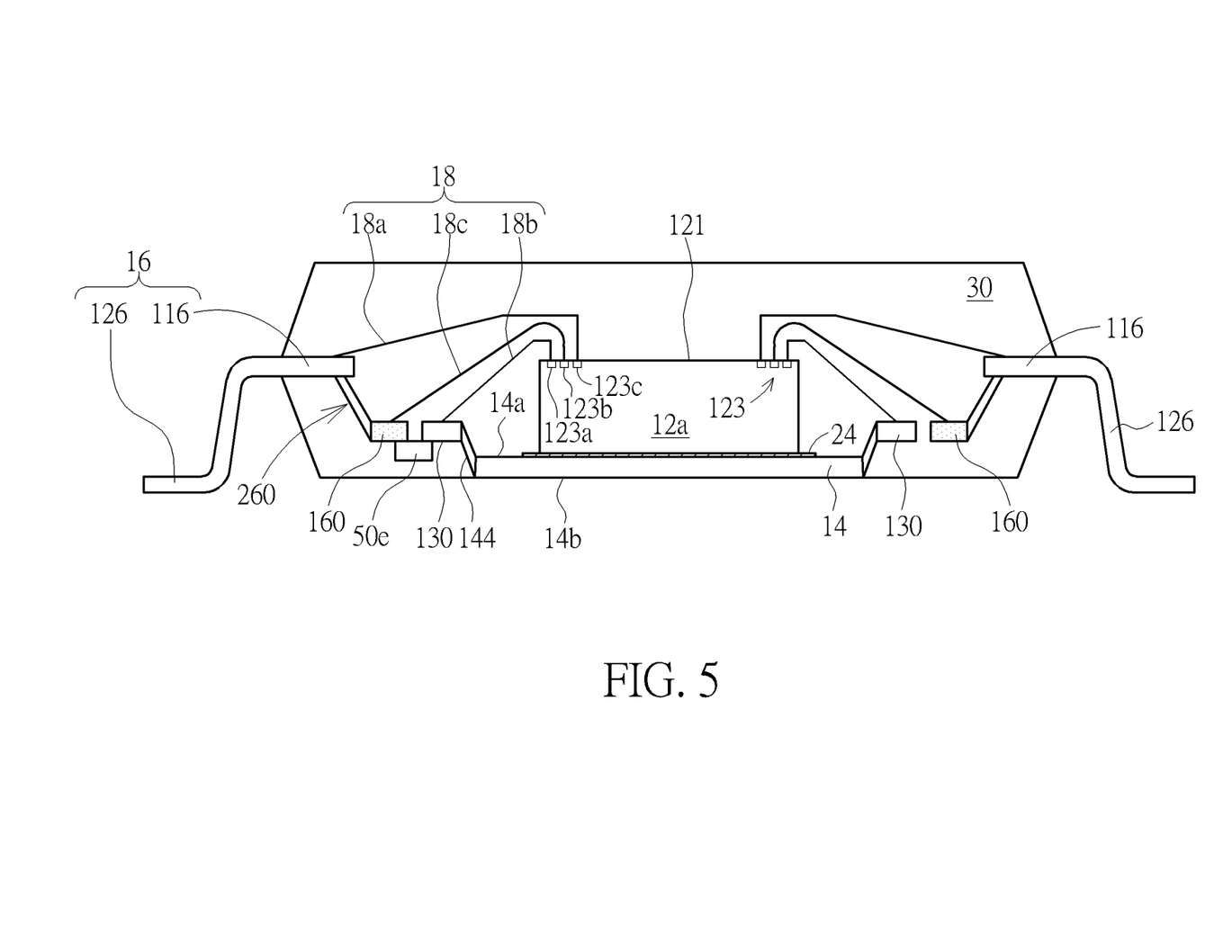
FIG. 5 is a schematic, cross-sectional diagram showing a leadframe package in accordance with another embodiment of the invention.

FIG. 4 is enlarged top view showing a germane portion of a leadframe package in accordance with another embodiment of the invention. FIG. 5 is a schematic, cross-sectional diagram showing a leadframe package in accordance with another embodiment of the invention, wherein like regions, layers or elements are designated by like numeral numbers. As shown in FIG. 4 and FIG. 5, the connecting bar 142 has a downset structure 242. A downset structure 260 is provided between the power lead 16a and the power bar 160, such that the power bar 160 can be coplanar with the ground bar 130. A decoupling capacitor 50d is mounted between the power bar 160 and the downset connecting bar 142 and a decoupling capacitor 50e is mounted between the power bar 160 and the ground bar 130.

To sum up, this disclosure at least contains the following benefits and advantages. 1). Lower power impedance can be achieved because more power wires can be bonded on a large area of the power bars. 2). Shorter decoupling path due to the incorporation of the in-package decoupling capacitors. 3). Higher assembly yield can be achieved due to relief of the power wires density on the power bar. 4) Less power lead is possible because additional power ring is added to reduce power impedance.

According to the embodiments of the invention, a wire-bondable surface mount device (SMD) may be mounted basically anywhere in the leadframe package. For example, the SMD may be mounted on the semiconductor die surface, on the die pad, on the ground bar, power bar, on the inner leads, or on the lead lock tape. The non-conductive lead lock tape is used to maintain lead coplanarity. The SMD may be mounted in the semiconductor package by using a non-conductive paste.

Figure 6:
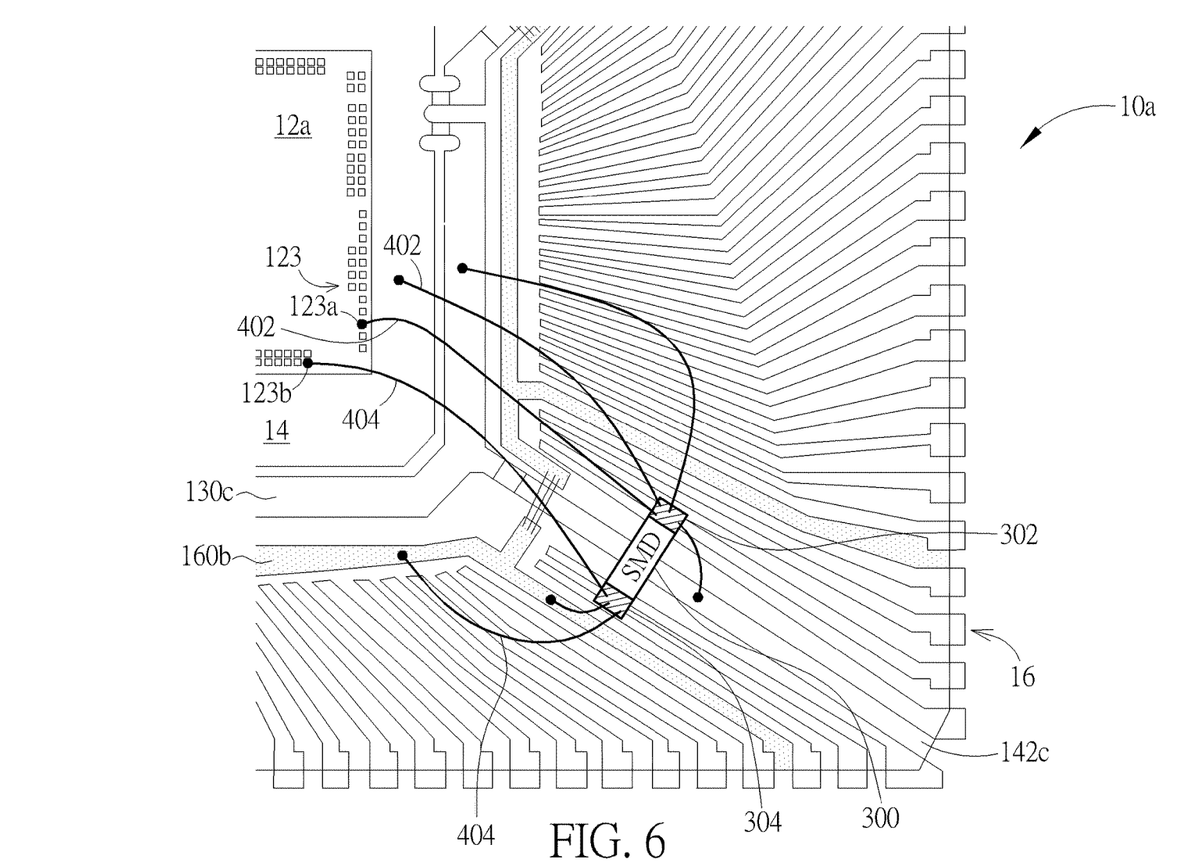
FIG. 6 is an enlarged top view showing a portion of a leadframe package including SMD according to another embodiment of the invention.
Figure 7:
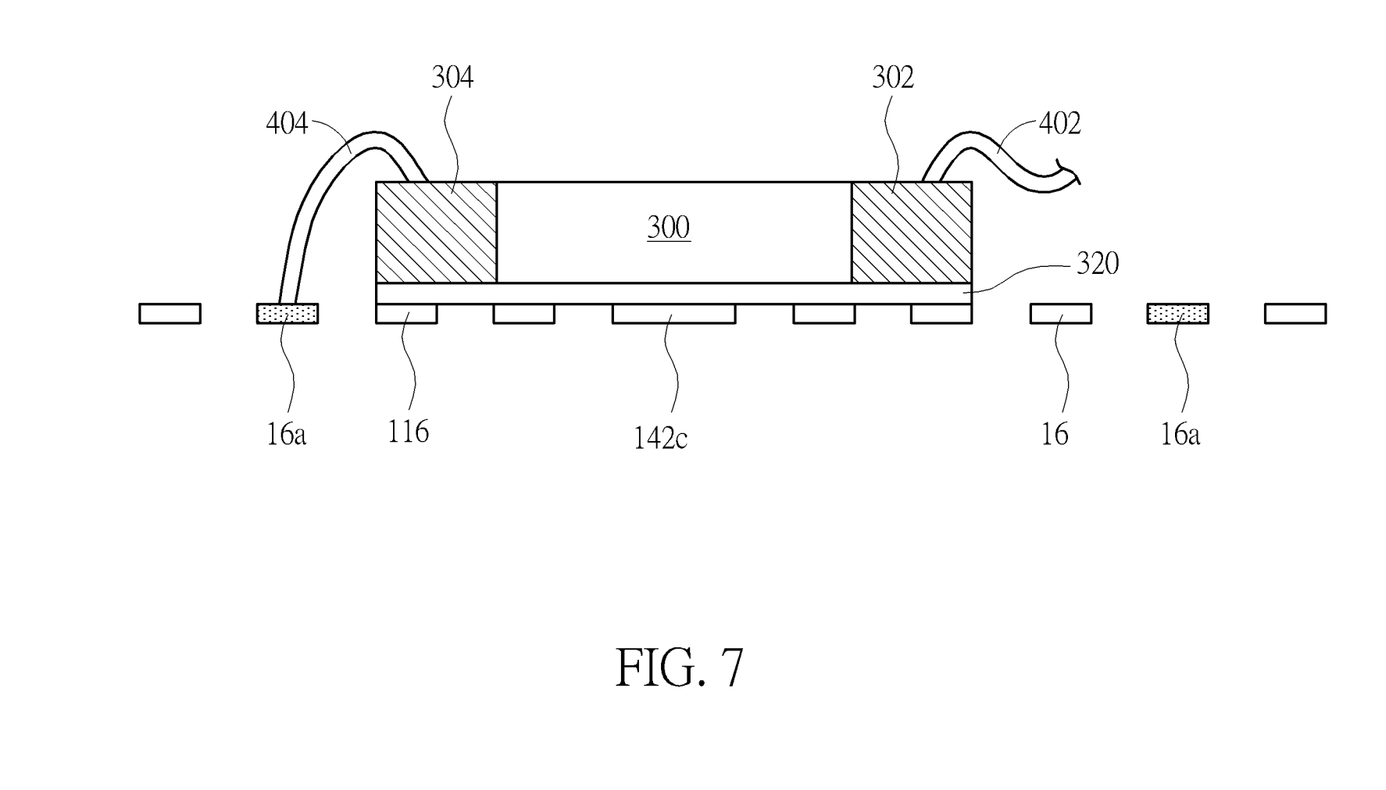
FIG. 7 is a schematic, cross-sectional diagram showing the SMD in the leadframe package.

Please refer to FIG. 6 and FIG. 7. FIG. 6 is an enlarged top view showing a portion of a leadframe package 10a including SMD according to another embodiment of the invention, wherein like regions, layers or elements are designated by like numeral numbers. FIG. 7 is a schematic, cross-sectional diagram showing the SMD in the leadframe package. As shown in FIG. 6 and FIG. 7, a SMD 300 may be mounted on the inner leads 116 and the connecting bar 142 through a non-conductive paste (an adhesive layer, a film, a polymer, or a lead lock tape) 320, but is not limited thereto. According to the embodiments of the invention, the SMD 300 may comprise a passive discrete device such as a resistor, an inductor, a capacitor, an RLC (resistor-inductor-capacitor) device, an ESD (electrostatic discharge) device, an IPD (integrated passive device), a crystal oscillator device, or the like.

According to the embodiments of the invention, the SMD 300 has two terminals: the first terminal 302 and the second terminal 304. The first terminal 302 may be electrically connected to the ground level such as ground pads 123a on the semiconductor die 12a, the ground bar 130c, the die pad 14, the connecting bar 142c, or ground leads of the leads 16 through the bond wires 402. The second terminal 304 may be electrically connected to the power level such as the power pads 123b on the semiconductor die 12a, the power bar 160b, or power leads 16a through the bond wires 404. The more wires and shorter wires are bonded or connected, the less power and ground impedance can be achieved. Preferably, at least three bond wires are bonded to each terminal of SMD 300. Preferably, each bond wire has a wire length less than 6 mm. The first terminal 302 and the second terminal 304 may include external electrodes plated with noble metal, such as gold (Au), silver (Ag), platinum (Pt), tin (Sn), or palladium (Pd), but is not limited thereto. In order to reduce the material cost and improve the wire bondability or solderability and adhesion with non-conductive paste in the package, the thickness of the noble metal covered on the terminals 302 and 304 is preferably less than 6 μm.

Figure 8:
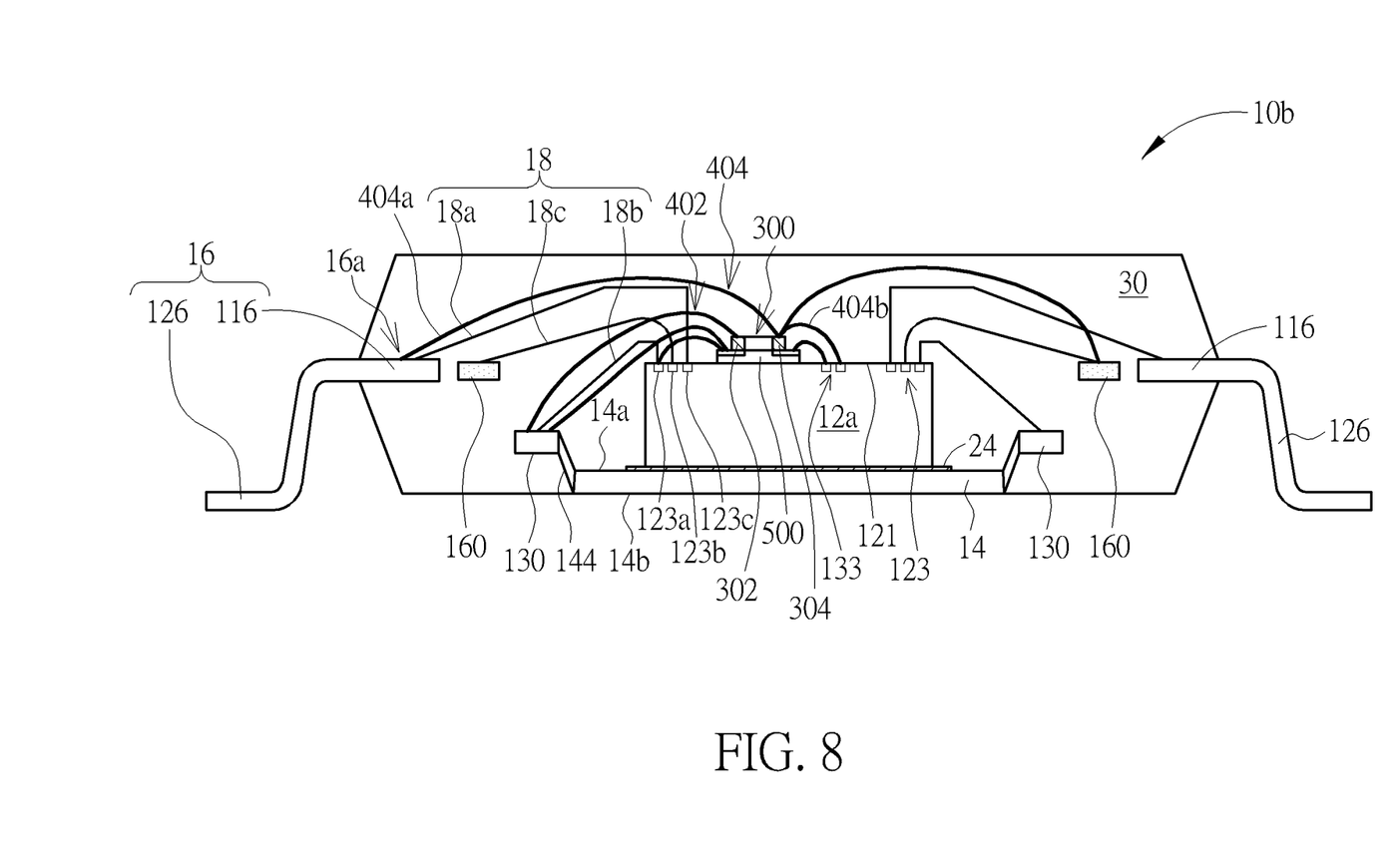
FIG. 8 is a schematic, cross-sectional view showing an exemplary leadframe package including SMD according to still another embodiment of the invention.

FIG. 8 is a schematic, cross-sectional view showing an exemplary leadframe package 10b including SMD according to still another embodiment of the invention, wherein like regions, layers or elements are designated by like numeral numbers. As shown in FIG. 8, the SMD 300 may be mounted on the active top surface 121 of the semiconductor die 12a. Optionally, the SMD 300 may be coupled to a substrate (or a circuit board) 500. The substrate 500 may comprise single-layer or multi-layer traces, via-plug, solder resistance layer, wiring or circuit patterns, but is not limited thereto. Bond wires 402 and 404 may be bonded to the circuit patterns (e.g. bonding pads) on the substrate 500 or the terminals of the SMD 300.

The semiconductor die 12a further comprises a plurality of I/O or power pads 133 on the other side of the SMD 300, which provide the power supply or signal input/output to the central part of the semiconductor die 12a and are opposite to the peripheral (I/O) bond pads 123. According to the embodiments of the invention, likewise, the SMD 300 may have at least two terminals: the first terminal 302 and the second terminal 304. The first terminal 302 may be electrically connected to the ground level such as ground pads 123a on the semiconductor die 12a, the ground bar 130, the die pad 14, the connecting bar, or ground leads of the leads 16 through the bond wires 402. The second terminal 304 may be electrically connected to the power level such as the power pads 133 on the semiconductor die 12a, the power bar 160, or power leads 16a through the bond wires 404. The first terminal 302 and the second terminal 304 may include external electrodes plated with noble metal, such as gold (Au), silver (Ag), platinum (Pt), tin (Sn), or palladium (Pd), but is not limited thereto. A continuous wire bonding configuration consisting of the bond wires 404a and 404b is provided between the power leads 16a and the power pads 133, which utilizes the second terminal 304 as a jump or relay pad such that the path resistance or channel impedance can be reduced and better power integrity can be achieved. In some embodiments of the present disclosure, the SMD 300 may be an integrated passive device (IPD) with at least four terminals including the power, the ground and the radio frequency (RF) input/output signals, which are electrically connected to the power pad 123b, the ground pad 123a, the I/O pads 123 on the active top surface 121 of the semiconductor die 12a or circuit patterns of the substrate 500.

Figure 9:
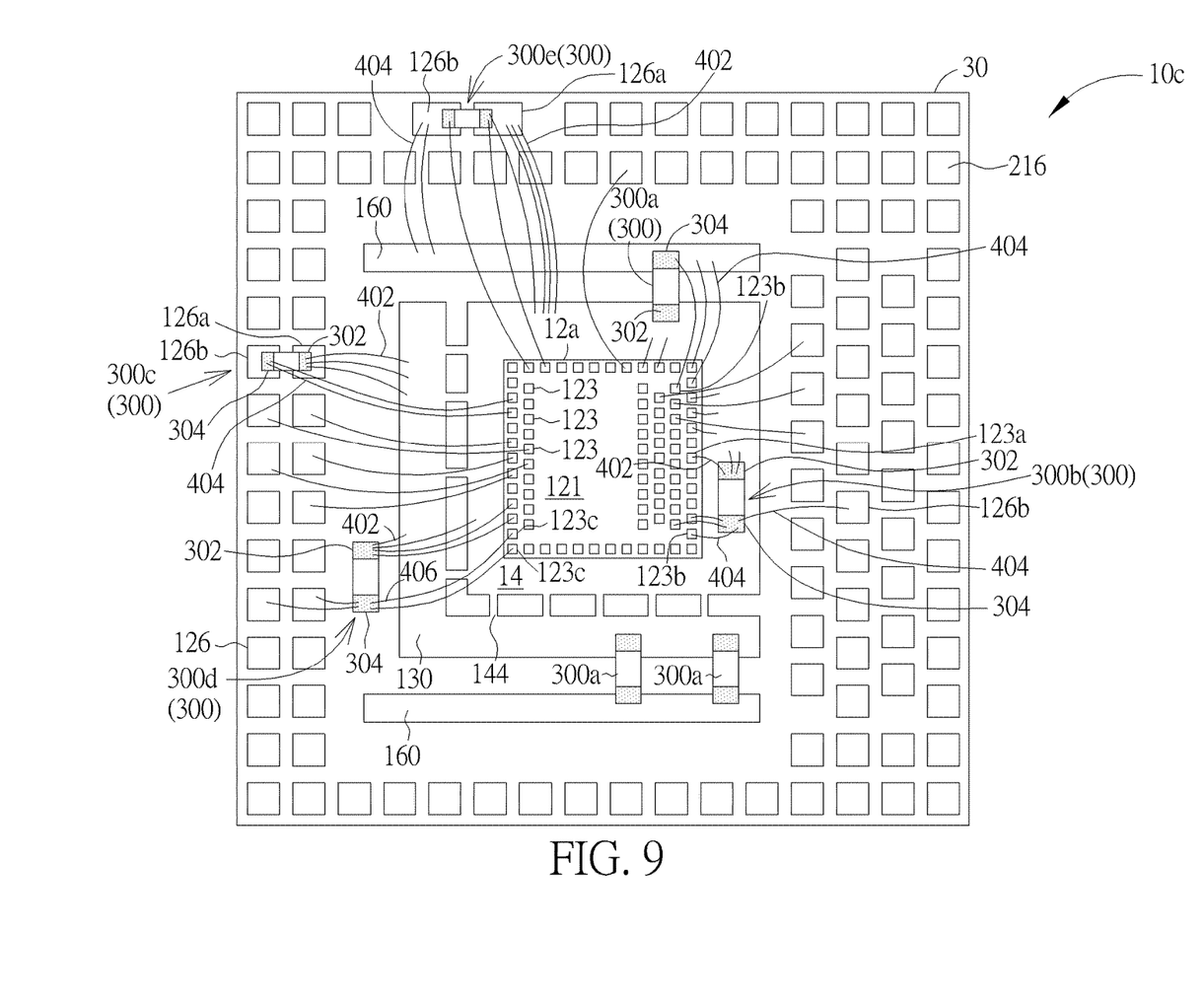
FIG. 9 illustrates a top perspective view of an exemplary semiconductor package including SMD according to still another embodiment of the invention.
Figure 10:
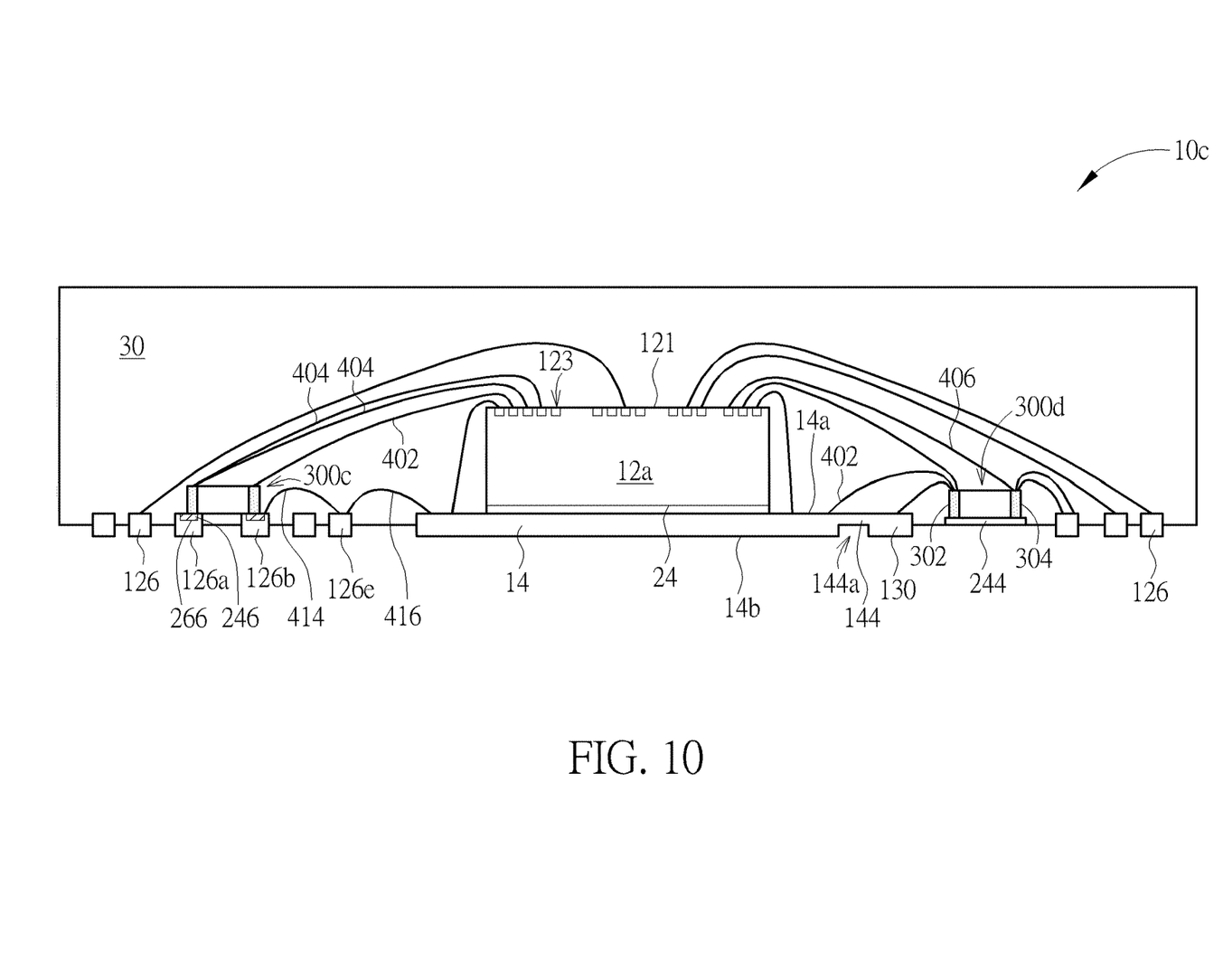
FIG. 10 is a schematic, cross-sectional diagram illustrating the semiconductor package including SMD of FIG. 9 according to still another embodiment of this invention.
Figure 11:
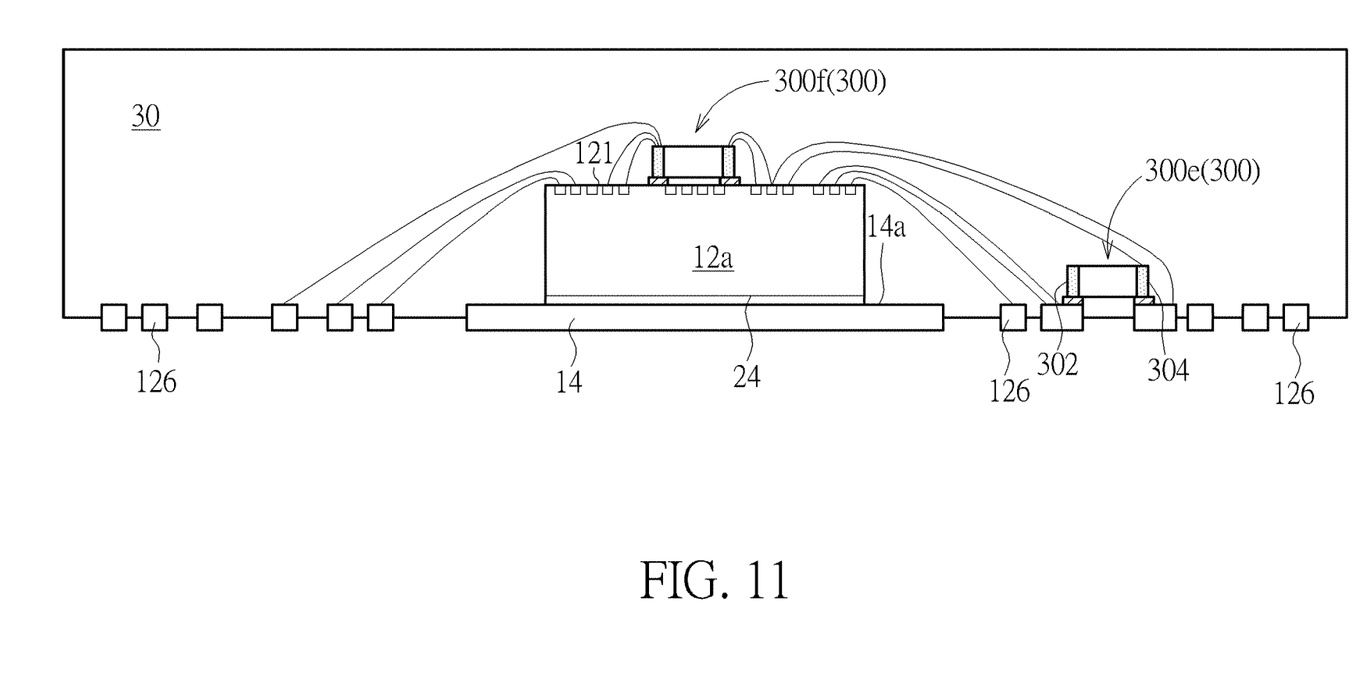
FIG. 11 is a schematic, cross-sectional view showing an exemplary semiconductor package including SMD mounted on the active top surface of the semiconductor die according to yet another embodiment of the invention.

Please refer to FIG. 9 to FIG. 11. FIG. 9 illustrates a top perspective view of an exemplary semiconductor package including SMD according to another embodiment of the invention, wherein like regions, layers or elements are designated by like numeral numbers. FIG. 10 is a schematic, cross-sectional diagram illustrating the semiconductor package including SMD of FIG. 9 according to another embodiment of this invention. FIG. 11 is a schematic, cross-sectional view showing an exemplary semiconductor package including SMD mounted on the active top surface of the semiconductor die according to yet another embodiment of the invention.

As shown in FIG. 9 and FIG. 10, the semiconductor package 10c comprises a die pad 14. A semiconductor die 12a is mounted on a die pad 14 and is adhered to a top surface 14a of the die pad 14 by using an adhesive 24 such as silver paste or epoxy. According to one embodiment, the bottom surface 14b of the die pad 14 is exposed within the package body. The exposed bottom surface 14b of the die pad 14 may be electrically connected to a ground layer or ground plane of a printed circuit board (PCB). According to one embodiment, several rows of bond pads 123 may be provided on an active top surface 121 of the semiconductor die 12a along four side edges thereof.

According to the illustrative embodiment, rows of terminal leads 126 are provided around the die pad 14. The terminal leads 126 and the die pad 14 may be plated with noble metal, such as gold (Au), nickel (Ni), silver (Ag), platinum (Pt), tin (Sn), or palladium (Pd), but is not limited thereto.

According to the illustrative embodiment, the semiconductor package 10c may further comprise a ground bar 130 disposed between the terminal leads 126 and the die pad 14. According to the illustrative embodiment, a plurality of tie bars 144 may be provided to connect the ground bar 130 with the die pad 14 such that the ground bar 130 and the die pad 14 have the same voltage potential, i.e., ground level. According to the illustrative embodiment, the ground bar 130 may extends along at least one peripheral edge of the die pad 14, but is not limited thereto.

According to the illustrative embodiment, the semiconductor package 10c may further comprise a power bar 160 disposed between the terminal leads 126 and the die pad 14 or between the ground bar 130 and the terminal leads 126. The power bar 160 provides power signals having voltage levels different from the ground level. For example, The power bar 160 may provide core power voltages.

According to the illustrative embodiment, wire-bondable surface mount devices (SMDs) 300 may be mounted in the semiconductor package. The SMDs 300, for example, SMD 300a, 300b, 330c, 300d, or 300e, may be mounted on the top surface 14a of the die pad 14, on the ground bar 130, power bar 160, or on the terminal leads 126. As shown in FIG. 11, the SMDs 300, for example, SMD 300f, may be mounted on the active top surface 121 of the semiconductor die 12a.

The SMDs 300 may be mounted in the semiconductor package by using a conductive paste or non-conductive paste depending on the location for disposing the SMD. According to the illustrative embodiment, the SMDs 300 may comprise a passive discrete device such as a resistor, an inductor, a capacitor, an RLC (resistor-inductor-capacitor) device, an ESD (electrostatic discharge) device, an IPD (integrated passive device), a crystal oscillator device, or the like.

For example, the SMD 300a may be a decoupling capacitor and may be mounted between the die pad 14 and the power bar 160 or mounted between the ground bar 130 and the power bar 160. The SMD 300a may have two terminals: the first terminal 302 and the second terminal 304. The first terminal 302 may be electrically connected to the ground level such as the die pad 14 or ground bar 130 by using a conductive paste. The second terminal 304 may be electrically connected to the power bar 160 and/or the power pads 123b on the semiconductor die 12a. The second terminal 304 may be electrically connected to the power pads 123b on the semiconductor die 12a through the bond wires 404. The power bar 160 may be electrically connected to the power pads 123 on the semiconductor die 12a through the bond wires 404. Multiple bond wires 404 may be bonded for lower impedance.

The first terminal 302 and the second terminal 304 may include external electrodes plated with noble metal, such as gold (Au), silver (Ag), platinum (Pt), tin (Sn), or palladium (Pd), but is not limited thereto For example, the SMD 300b may be a decoupling capacitor and may be mounted directly on the die pad 14. The SMD 300b may be adhered to the top surface 14a of the die pad 14 by using, for example, a non-conductive paste. The SMD 300b may have two terminals: the first terminal 302 and the second terminal 304. The first terminal 302 may be electrically connected to the grounded die pad 14 through the bond wires 402. The second terminal 304 may be electrically connected to the power pads 123b on the semiconductor die 12a and the terminal leads (power leads) 126b through the bond wires 404.

For example, the SMD 300c may be a decoupling capacitor and may be mounted directly on the terminal leads 126. Likewise, the SMD 300c may have two terminals: the first terminal 302 and the second terminal 304. The first terminal 302 and the second terminal 304 may be adhered to the terminal leads 126a and 126b, respectively, by using a non-conductive paste, or a conductive paste. The non-conductive paste may comprise epoxy, an adhesive layer, polymer, or a lead lock tape. The conductive paste may comprise solder paste, silver paste, copper paste, or aluminum paste.

The first terminal 302 may be electrically connected to the terminal lead (ground lead) 126a. The first terminal 302 may be further electrically connected to the ground bar 130 through the bond wires 402. The second terminal 304 may be electrically connected to the terminal leads (power leads) 126b. The second terminal 304 may be further electrically connected to the power pads 123b on the semiconductor die 12a through the bond wires 404.

The exemplary SMD 300c is also shown in FIG. 10. In FIG. 10, the solder paste 246 may be disposed within a recessed region 266 on each of the terminal lead (ground lead) 126a and terminal lead (power lead) 126b in order to prevent over-flow of the solder paste 246 and avoid shorting during SMT process.

As can be seen in FIG. 9 and FIG. 10, for example, the SMD 300d may be disposed between the ground bar 130 and the inner row of terminal leads 126. The SMD 300d may be initially adhered to a half-etched carrier substrate by using a non-conductive paste 244. In a later stage, the portion of the half-etched carrier substrate directly under the SMD 300d is etched away so as to expose the lower surface of the non-conductive paste 244, as can be seen in FIG. 10.

For example, the SMD 300d may be an ESD protection device and may have two terminals: the first terminal 302 and the second terminal 304. The first terminal 302 may be electrically connected to the ground bar 130, the die pad 14, and/or the ground pads 123a on the semiconductor die 12a through the bond wires 402. The second terminal 304 may be electrically connected to the terminal leads 126 and/or the signal pads 123c on the semiconductor die 12a through the bond wires 406.

For example, the SMD 300e may be a decoupling capacitor and may be mounted on the terminal leads 126a and 126b by using a non-conductive paste, or a conductive paste. The non-conductive paste may comprise epoxy, an adhesive layer, polymer, or a lead lock tape. The conductive paste may comprise solder paste, silver paste, copper paste, or aluminum paste. The terminal lead 126b may be electrically connected to the power bar 160 or the power pads 123 on the semiconductor die 12a through the bond wires 404. The terminal lead 126a may be electrically connected to the die pad 14, the ground bar 130, or the ground pads 123 on the semiconductor die 12a through the bond wires 402.

As shown in FIG. 10, because the length of the bond wires during wire-bonding is limited, the bond wire 414 may be bonded between the terminal lead 126b and a relay lead 126e first, and then the bond wire 416 may be bonded between the relay lead 126e and the die pad 14, the ground bar 130, or the ground pads 123 on the semiconductor die 12a.

It is to be understood that in a case that the SMD is an inductor, the two terminals of the SMD 300 may be electrically coupled to two power ends respectively, and may be electrically coupled to two signal ends in a case that the SMD is a resistor.

As can be seen in FIG. 10, the semiconductor die 12a, the leadframe including the die pad 14 and the terminal leads 126, the SMDs 300, and the bond wires 402, 404, 406, 414, and 416 are encapsulated in a molding compound 30. The lower portion of the each of the terminal leads 126, the bottom surface of the die pad 14, the bottom surface of the ground bar 130, the bottom surface of the tie bar 144, and the bottom surface of the power bar 160 are exposed from the bottom of the semiconductor package 10c. The die pad 14, the ground bar 130, the power bar 160, the tie bars 144 and the terminal leads 126 are coplanar. It is noteworthy that each of the tie bars 144 may be half-etched or partially etched to form a notch 144a. The notch 144a can be on the top portion or bottom portion of the tie bar 144. The half-etched tie bars 144 achieves a higher impedance between the die pad 14 and the ground bar 130 that can partition analog and digital ground wires bonded on the ground bar 130 and the die pad 14 reducing the mutual interference.

In general, the semiconductor package 10c may be fabricated by half etching a first side of a carrier to form top portions of a lead array and a die attach surface of a die attach pad, then mounting the semiconductor die and the SMDs on the carrier, wire bonding the semiconductor die and the SMDs, then encapsulating the semiconductor die, the SMDs, the upper portions of the terminal leads, and the bond wires with a molding compound, and then half etching a second side of the carrier opposite to the first side to form bottom portions of the lead array and the die attach pad. Therefore, no connecting bar is required in the semiconductor package 10c to initially support the die pad 14.

It is advantageous to use the present invention because the semiconductor package 10c provides similar I/O number approaching that of a BGA-type chip-scale package (CSP) with lower cost since the expensive substrate is replaced by lead frame. The semiconductor package 10c is suited for low pin-count to high pin-count applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a die pad having a top surface and a bottom surface;
   a semiconductor die mounted on the top surface of the die pad;
   rows of terminal leads having a top surface and a bottom surface disposed around the die pad;
   a ground bar disposed between the terminal leads and the die pad;
   a plurality of tie bars connecting the ground bar with the die pad;
   a surface mount device (SMD) comprising a first terminal and a second terminal mounted in the semiconductor package, wherein a first bond wire is bonded to the first terminal or the second terminal; and
   a molding compound encapsulating the semiconductor die and the SMD, and at least partially encapsulating the die pad and the terminal leads, wherein the bottom surfaces of the die pad and the terminal leads are exposed outside the semiconductor package.

2. The semiconductor package according to claim 1, wherein each of the tie bars is half-etched or partially etched so as to form a notch.

3. The semiconductor package according to claim 1, wherein the SMD is disposed between the die pad and the terminal leads.

4. The semiconductor package according to claim 1, wherein the SMD is mounted on the die pad.

5. The semiconductor package according to claim 1, wherein the SMD is mounted on the terminal leads.

6. The semiconductor package according to claim 1, wherein the SMD is mounted on the semiconductor die.

7. The semiconductor package according to claim 1, wherein a second bond wire is bonded to the first terminal or the second terminal.

8. The semiconductor package according to claim 7, wherein the first terminal and the second terminal of the SMD are plated with noble metal comprising gold (Au), silver (Ag), platinum (Pt), tin (Sn), or palladium (Pd).

9. The semiconductor package according to claim 1, wherein the SMD comprises a resistor, an inductor, a capacitor, an RLC (resistor-inductor-capacitor) device, an ESD (electrostatic discharge) device, an IPD (integrated passive device), or a crystal oscillator device.

10. The semiconductor package according to claim 1 further comprising:
a power bar disposed between the terminal leads and the die pad or between the ground bar and the terminal leads.

11. The semiconductor package according to claim 10, wherein the SMD is mounted between the die pad and the power bar or mounted between the ground bar and the power bar.

12. The semiconductor package according to claim 10, wherein the first terminal is electrically connected to a ground pad on the semiconductor die, the ground bar, the die pad, or a ground lead of the terminal leads.

13. The semiconductor package according to claim 12, wherein the second terminal is electrically connected to a power pad on the semiconductor die, the power bar, or a power lead of the terminal leads.

14. The semiconductor package according to claim 10, wherein the die pad, the ground bar, the power bar and the terminal leads are coplanar.

15. A semiconductor package, comprising:
a die pad having a top surface and a bottom surface;
a semiconductor die mounted on the top surface of the die pad;
rows of terminal leads having a top surface and a bottom surface disposed around the die pad;
a surface mount device (SMD) mounted on at least one of the terminal leads, wherein the terminal lead is bonded with a bond wire in the semiconductor package;
a ground bar disposed between the terminal leads and the die pad;
a plurality of tie bars connecting the ground bar with the die pad; and
a molding compound encapsulating the semiconductor die and the SMD, and at least partially encapsulating the die pad and the terminal leads, wherein the bottom surface of the die pad and terminal leads are exposed outside the semiconductor package.

16. The semiconductor package according to claim 15, wherein each of the tie bars is half-etched or partially etched so as to form a notch.

17. The semiconductor package according to claim 15 further comprising:
a power bar disposed between the terminal leads and the die pad or between the ground bar and the terminal leads.

18. The semiconductor package according to claim 17, wherein the die pad, the ground bar, the power bar and the terminal leads are coplanar.

19. The semiconductor package according to claim 15, wherein the SMD is mounted between the die pad and the terminal lead or mounted between the ground bar and the terminal lead.

20. The semiconductor package according to claim 15, wherein the SMD comprises a first terminal and a second terminal, and a second bond wire is bonded to the first terminal or the second terminal.

21. The semiconductor package according to claim 20, wherein the first terminal is electrically connected to a ground pad on the semiconductor die, the ground bar, the die pad, or a ground lead of the terminal leads.

22. The semiconductor package according to claim 20, wherein the second terminal is electrically connected to a power pad on the semiconductor die, the power bar, or a power lead of the terminal leads.

23. The semiconductor package according to claim 15, wherein the SMD comprises a resistor, an inductor, a capacitor, an RLC (resistor-inductor-capacitor) device, an ESD (electrostatic discharge) device, an IPD (integrated passive device), or a crystal oscillator device.

* * * * *